United States Patent [19]

Yamazaki et al.

[11] Patent Number: 5,693,541
[45] Date of Patent: Dec. 2, 1997

[54] METHOD FOR MANUFACTURING A SEMICONDUCTOR DEVICE USING A SILICON NITRIDE MASK

[75] Inventors: Shunpei Yamazaki, Tokyo; Hongyong Zhang, Kanagawa, both of Japan

[73] Assignee: Semiconductor Energy Laboratory Co., Ltd, Kanagawa, Japan

[21] Appl. No.: 518,364

[22] Filed: Aug. 23, 1995

[30] Foreign Application Priority Data

Aug. 26, 1994 [JP] Japan ................... 6-225598

[51] Int. Cl.$^6$ .................................................. H01L 21/84
[52] U.S. Cl. ........................... 437/21; 437/41; 437/973; 148/DIG. 16; 257/66
[58] Field of Search ................... 437/21, 40 TFT, 437/41 TFT, 40 TFI, 41 TFI, 88, 101, 142, 233, 967, 973; 148/DIG. 16, DIG. 122; 257/66, 72, 75

[56] References Cited

U.S. PATENT DOCUMENTS

| | | |
|---|---|---|
| 4,335,161 | 6/1982 | Luo . |
| 4,343,081 | 8/1982 | Morin et al. . |
| 5,120,667 | 6/1992 | Tarui et al. ........................ 437/21 |
| 5,147,826 | 9/1992 | Liu et al. ........................... 437/233 |
| 5,275,851 | 1/1994 | Fonash et al. ..................... 437/233 |
| 5,403,772 | 4/1995 | Zhang et al. ...................... 437/101 |
| 5,608,232 | 3/1997 | Yamazaki et al. ................ 257/66 |

FOREIGN PATENT DOCUMENTS 58-102560  6/1983  Japan .

OTHER PUBLICATIONS

C. Hayzelden et al., "In Situ Transmission Electron Microscopy Studies of Silicide–Mediated Crystallization of Amorphous Silicon" Appl. Phys. Lett. 60(1992) 225.

A.V. Dvurechenskii et al., "Transport Phenomena in Amorphous Silicon Doped by Ion Implantation of 3d Metals", Phys. Stat. Sol. A95(1986)635.

T. Hempel et al., "Needle–Like Crystallization of Ni Doped Amorphous Silicon Thin Films", *Solid State Communications*, vol. 85, No. 11, pp. 921–924, 1993.

R. Kakkad et al., "Crystallized Si films by low–temperature rapid thermal annealing of amorphous silicon," *J. Appl. Phys.*, 65(5), Mar. 1, 1989, pp. 2069–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

S. Takenaka et al., Jpn. J. Appl. Phys., 29(12)(1990)L2380 "High Mobility Poly–Si TFTs using SPC a–Si Films Deposited by PECVD", Dec. 1990.

*Primary Examiner*—Charles L. Bowers, Jr.
*Assistant Examiner*—Leon Radomsky
*Attorney, Agent, or Firm*—Sixbey, Friedman, Leedom & Ferguson, P.C.; Gerald J. Ferguson, Jr.

[57] ABSTRACT

An amorphous silicon film is formed on a glass substrate by a CVD method, and a mask is formed of a silicon nitride film. Then, nickel is selectively doped into the amorphous silicon film by spin-coating solution containing nickel onto the amorphous silicon film. Thereafter, the amorphous silicon film is crystallized by a thermal treatment.

19 Claims, 6 Drawing Sheets

METHOD FOR MANUFACTURING A SEMICONDUCTOR DEVICE USING A SILICON NITRIDE MASK

BACKGROUND OF THE INVENTION

1. Field of the Invention

The present invention relates to an apparatus and a method for manufacturing semiconductor devices which use semiconductor material having crystallinity.

2. Description of the Related Art

A thin film transistor (hereinafter referred to as "TFT") using thin film semiconductor material has been well known. The TFT is constructed by forming thin film semiconductor on a substrate and using the thin film semiconductor. The TFT has been used for various integrated circuits, especially an electrooptical device, and particularly much attention is paid to the TFT as a switching device which is provided to each pixel of an active matrix type of liquid crystal display device, or a driver device formed in its peripheral circuits.

Amorphous silicon film is most easily used as thin film semiconductor for the TFT, however, it has a problem that its electric characteristics is not good. In order to improve the characteristics of the TFT, it is a better way to use a silicon film having crystallinity as thin film semiconductor. The crystalline silicon film is known as polycrystal silicon, polysilicon or microcrystal silicon or the like. In order to obtain this crystalline silicon, an amorphous silicon film is first formed and then crystallized by heating.

However, the crystallization by heating requires a heating temperature of 600° C. or more and a heating time above 10 hours, so that it is difficult to use a glass substrate as a substrate. For example, a glass strain temperature of Corning 7059 glass which is used for an active matrix type liquid crystal display device is equal to 593° C. Therefore, the heating temperature exceeding 600° C. causes some problem when a large-scale substrate is required to be used.

SUMMARY OF THE INVENTION

In order to solve the above problems, the same inventors as this application previously proposed a method of manufacturing semiconductor devices as disclosed in Japanese patent Application No. Hei-5-294633. In the method as disclosed in this patent application, a crystalline silicon film was obtained by adding catalysts, especially nickel to an amorphous silicon film with solution and performing a heating treatment at a low temperature and for a short time. The present invention has been made to improve the apparatus and method of manufacturing semiconductor devices according to the Japanese patent Application No. Hei-5-294633 which was previously proposed by the inventors of this application, and through various studies on the above apparatus and method, the inventors of this application have proposed the following two crystallizing methods. In one method, an area where crystal growth is made in a substantially perpendicular direction to the substrate in a region which is directly doped with catalysts (hereinafter referred to as "longitudinal growth area") is used as a device-forming area. On the other hand, in the other method, catalysts are selectively added, and an area where crystal growth is made in a substantially horizontal direction to the substrate in a peripheral region of the catalysts-doped region (hereinafter referred to as "lateral growth area) is used as a device-forming area.

Through various studies of these two crystallizing methods, it has been concluded that the latter method using the lateral crystal growth process is more preferable on the characteristics of completed devices, and the inventors have made a further consideration on this lateral-growth crystallizing method.

An object of the present invention is to improve the apparatus and method disclosed in the Japanese Patent Application No. Hei-5-294633, and it is to provide an apparatus and a method of manufacturing thin film semiconductor having crystallinity by a heating treatment at a temperature of 600° C. or less using catalysts, which has higher controllability, larger process margin and higher productivity than the Japanese patent Application No. Hei-5-294633.

In order to attain above object, according to a first aspect of the present invention, a method of manufacturing a semiconductor device, comprises a step of forming a silicon oxide film and an amorphous silicon film on a substrate having an insulating surface, a step of performing a heat treatment on the film-formed substrate sequentially to the film-forming step without exposing the film-formed substrate to atmospheric air to thereby remove hydrogen, a step of forming a silicon nitride film on the hydrogen-removed substrate sequentially to the hydrogen-removing step, a step of patterning the silicon nitride film to selectively expose the amorphous silicon film, a step of doping metal elements so as to be contacted with the exposed amorphous silicon film to promote crystal growth of the exposed amorphous silicon film, and a step of performing a heat treatment on the amorphous silicon film to crystallize the amorphous silicon film in a direction parallel to the substrate from an area in which the metal elements are doped.

According to another aspect of the present invention, an apparatus for manufacturing semiconductor devices, comprises a first treatment chamber for forming a silicon oxide film and an amorphous silicon film on a substrate having an insulating surface, a second treatment chamber for performing a heat treatment on the film-formed substrate to remove hydrogen therefrom sequentially to the film-forming operation in the first treatment chamber without exposing the substrate to atmospheric air, a third treatment chamber for forming a silicon nitride film on the hydrogen-removed substrate sequentially to the hydrogen-removing operation in the second treatment chamber, and a common chamber which commonly intercommunicates with the first treatment chamber, the second treatment chamber and the third treatment chamber, wherein the first, second and third treatment chambers are designed in a hermetic structure, and the common chamber has means for feeding a substrate or sample.

According to another aspect of the present invention, a method of manufacturing semiconductor devices, comprises a step of forming a silicon oxide film and an amorphous silicon film on a substrate having an insulating surface, a step of performing a heat treatment on the film-formed substrate sequentially to the film-forming step without exposing the film-formed substrate to atmospheric air to thereby remove hydrogen, a step of forming a silicon nitride film on the hydrogen-removed substrate sequentially to the hydrogen-removing step, a step of patterning the silicon nitride film in the form of an active layer to selectively expose the amorphous silicon film, a step of doping metal elements so as to be contacted with the exposed amorphous silicon film to promote crystal growth of the exposed amorphous silicon film, a step of performing a heat treatment on the amorphous silicon film to crystallize the amorphous silicon film in a direction parallel to the substrate from an area in which the metal elements are doped, and a step of patterning the crystallized silicon film using the silicon nitride film as a mask to form an active layer.

According to another aspect of the present invention, a method of manufacturing semiconductor devices, comprises a step of forming a silicon nitride film as a mask to form an active layer on an amorphous silicon film which is formed on a substrate having an insulating surface, a step of doping metal elements using the silicon nitride film as a mask to promote crystal growth of the amorphous silicon film, a step of performing a heat treatment to crystallize the amorphous silicon film, and a step of forming an active layer using the silicon nitride film as a mask.

DETAILED DESCRIPTION OF THE PREFERRED EMBODIMENTS

Preferred embodiments according to the present invention will be described hereunder with reference to the accompanying drawings.

Figure 1A:
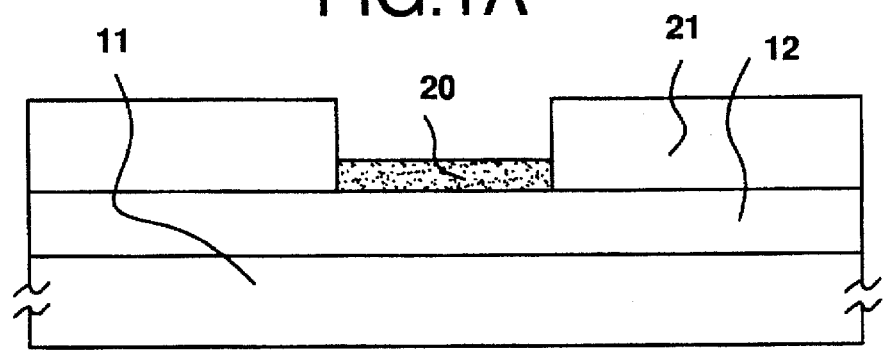
FIGS. 1A to 1C are diagrams showing a series of processes of manufacturing a semiconductor device of an embodiment according to the present invention.
Figure 1B:
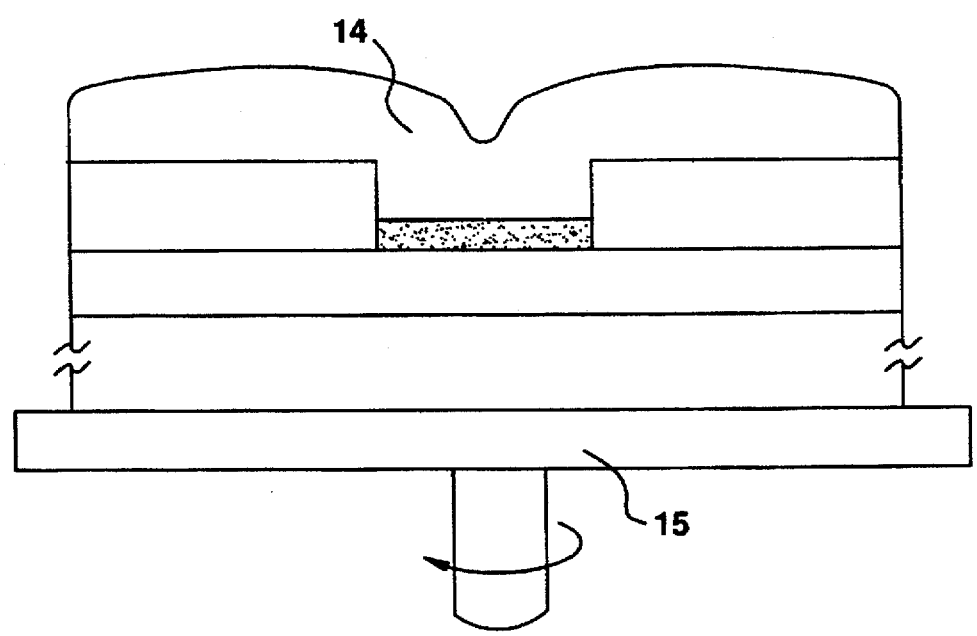
Figure 1C:
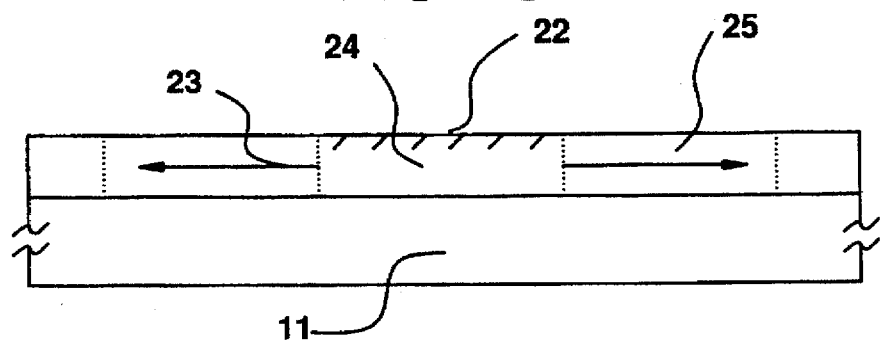

Before describing preferred embodiments according to the present invention, the lateral-growth crystallizing method as disclosed in the Japanese Patent Application No. Hei-5-294633 will be briefly described with reference to FIGS. 1A to 1C.

First, an undercoat film of silicon oxide is formed on a glass substrate such as a Corning 7059 substrate or the like, and an amorphous silicon film 12 is formed at a thickness of 100 to 5000 Å, preferably from 500 to 800 Å on the substrate 11 by a plasma CVD treatment or a pressure-reduced heating CVD treatment.

Subsequently, a mask material film 21 which is typically formed of silicon oxide film is formed on the amorphous silicon film 12, and an opening portion through which nickel will be added is formed in the mask material 21 so that the amorphous silicon film below the mask material 21 is exposed to the opening portion. Thereafter, the surface of the amorphous silicon film which is exposed to the opening portion is oxidized thinly if occasion demands (it is represented by reference numeral 20 in FIG. 1), and nickel is doped into the amorphous silicon film with solution 14 containing nickel.

The substrate which has been doped with nickel by the method as described above is subjected to a heat treatment at 450° to 600° C., typically at about 550° C. under an atmosphere of inert gas such as $N_2$ or the like or under an oxidizing atmosphere to form a crystalline silicon film 25 whose crystal growth is made in a lateral direction.

An attempt was made to change the mask material from the silicon oxide film to a silicon nitride film for a series of processes as described above, and it was experimentally proved that a long-term heat treatment caused nickel to pass through the silicon oxide film and reach the amorphous silicon film when the silicon oxide film was used as the mask material. This induces a phenomenon of longitudinal growth of passed nickel occurs, and thus it was observed that the lateral growth was disturbed by the longitudinal growth. On the other hand, the above phenomenon was not observed when the silicon nitride film is used as the mask material. However, in this case, it was also observed that the lateral growth degree was somewhat smaller as compared with the silicon oxide mask. As a result of an additional experiment, it was found out that the reduction in the lateral growth degree can be avoided by removing hydrogen in advance. That is, it is required as a pre-treatment for crystallization to remove hydrogen from the amorphous silicon film. However, when the silicon nitride film is used, it is difficult to remove hydrogen from the amorphous silicon film.

Next, a comparison experiment was made for the following two cases, a case where the undercoat film, the amorphous silicon film and the mask material film were sequentially (continuously) formed on the substrate without being exposed to the atmospheric air (hereinafter referred to as "sequential film-forming process") and a case where these films were separately formed on the substrate with being exposed to the atmospheric air (hereinafter referred to as "separate film-forming process"). Through this comparison experiment, it was proved that the lateral growth distance was longer and the crystallinity was higher in the sequential film forming process than the separate film forming process even though the same film quality was set in both the cases. This fact would mean that the lateral growth process that crystal growth is made in a substantially parallel direction to the substrate is strongly affected by the condition of the interface.

Accordingly, on the basis of the series of experiments as described above, the following crystal growth method using the lateral crystal growth having high reproducibility and high controllability includes; a step of continuously (sequentially) forming a silicon oxide film and an amorphous silicon film on a glass substrate, a step of performing a heat treatment on the film-formed substrate sequentially to the film-forming step without being exposed to atmospheric air to remove hydrogen from the substrate, a step of forming a silicon nitride film on the hydrogen-removed substrate sequentially to the hydrogen-removing step, a step of subjecting the substrate having the silicon oxide film, the amorphous silicon film and the silicon nitride film formed thereon to a patterning treatment and an etching treatment of the silicon nitride film to partially expose the amorphous silicon film, a step of coating the substrate with solution containing nickel to doped nickel into the selectively exposed amorphous silicon film, and a step of performing a heat treatment on the nickel-coated substrate to crystallize the amorphous silicon film.

In order to achieve a series of processes as described above, an apparatus in which a silicon oxide film, an amorphous silicon film and a silicon nitride film can be formed in succession and a heat treatment (hydrogen removing process) can be performed without exposing these films to atmospheric air even only once is required as a multipurpose substrate treatment device.

Specifically, the multipurpose substrate treatment includes plural pressure-reducible treatment chambers, and a common pressure-reducible chamber through which the plural treatment chambers intercommunicate with one another, and which has substrate feeding means for feeding the substrate between the common chamber and each treatment chamber, wherein at least one of the treatment chambers is capable of forming a silicon oxide film using a plasma CVD method, at least one of the treatment chambers is capable of forming silicon nitride film using a plasma CVD method, at least one of the treatment chambers is capable of forming an amorphous silicon film using a plasma CVD method, and at least one of the treatment chambers is capable of performing a heat treatment at 400° C. or more on plural substrates at the same time.

Figure 2:
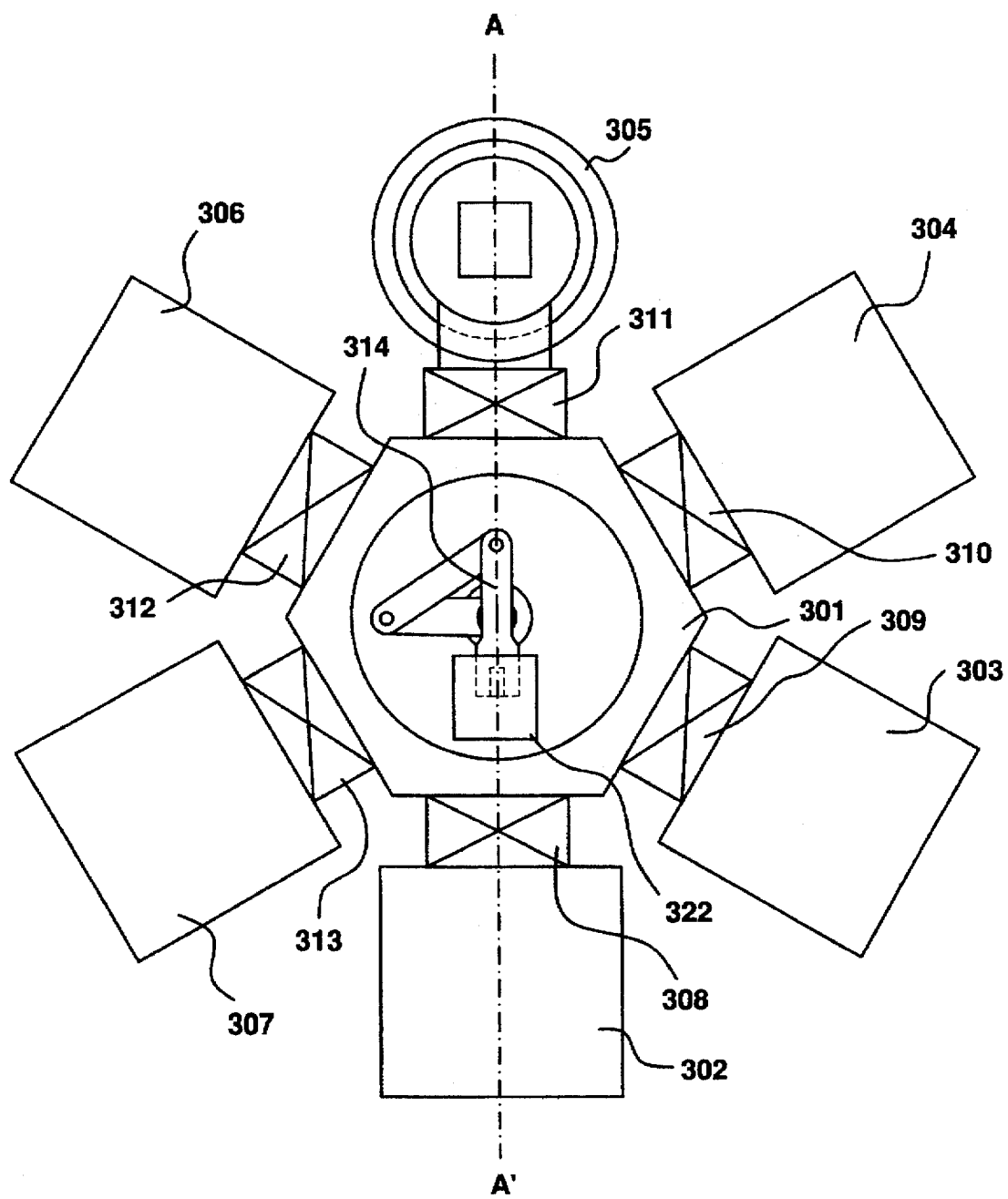
FIG. 2 shows an apparatus of manufacturing a semiconductor device.
Figure 3:
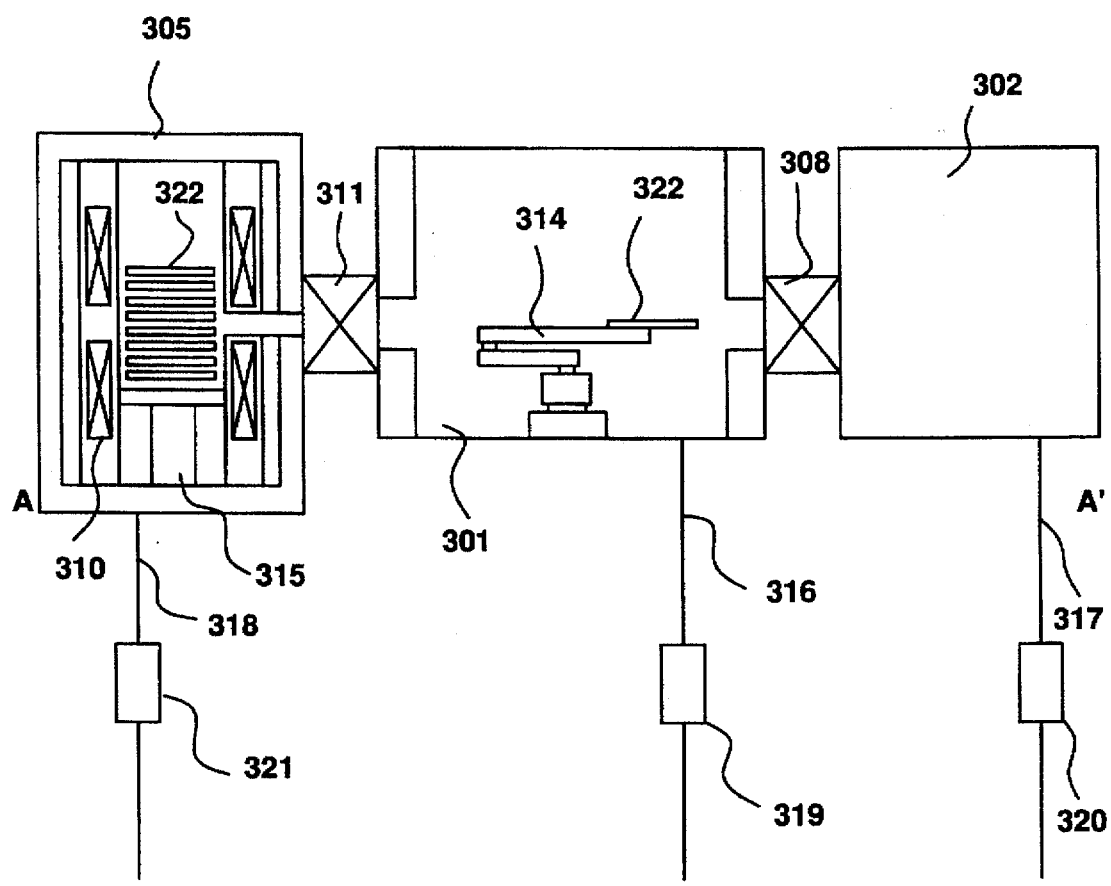
FIG. 3 shows the apparatus of manufacturing a semiconductor device.

The apparatus thus constructed is shown in FIGS. 2 and 3.

The apparatus shown in FIG. 2 can be used for multipurpose, and it can be constructed by combining the desired number of treatment chambers which are used to perform desired film forming processes and annealing processes. As the substrate to be treated in the apparatus shown in FIG. 2 may be used a glass substrate, a silicon substrate, an insulating substrate, a semiconductor substrate or the like. Namely, any substrate may be used insofar as it has an insulating surface. For example, a glass substrate which is inexpensive is generally used for an electrooptical device such as an active matrix type liquid crystal display device, an image sensor or the like.

For example, in the case of FIG. 2, the apparatus may be constructed as follows. That is, a chamber 301 is used as a substrate carry chamber which corresponds to the common chamber, chambers 306 and 307 of treatment chambers in which various kinds of treatments are performed are used as spare chambers, one of which is used for feed-in of the substrate and the other of which is used for feed-out of the substrate, a chamber 302 is used as a plasma CVD apparatus for forming an insulation film, a chamber 303 is used as a plasma CVD apparatus for forming an amorphous silicon film, a chamber 304 is used as a plasma CVD apparatus for forming a silicon nitride film, and a chamber 305 is used as a heat treatment furnace to remove hydrogen. In the apparatus thus constructed, only the heat treatment process needs a long treatment time of several hours and it becomes the main factor of reducing the total throughput of this process. Therefore, it is important to construct the apparatus so that plural substrates 322 are simultaneously heated by a heater 310, carried to a substrate feeding position by a stage 315 if necessary, and then carried to a next process while fed by a robot arm 314. Here, the spare chambers may be also called as treatment chambers in the meaning that these chambers have functions of feeding in and out the substrate. The respective treatment chambers are partitioned from one another by gate valves 308–313, and they can be independently and individually decompressed by vacuum pumps 319–321 respectively, so that gas occurring at a treatment time can be prevented from contaminating into another treatment chamber. The substrates 322 are carried by the robot arm 314, and the throughput can be improved by the multitask.

Any combination like the combination shown in FIG. 2 can be freely performed. As the elements to be combined may be used plasma CVD, pressure-reduced heat CVD (hereinafter referred to as "LPCVD"), photo CVD, microwave CVD, heating furnace, anneal furnace by light irradiation, sputtering, plasma anneal, plasma etching (isotropic or anisotropic). In order to construct the apparatus of the present invention, at least the elements as described above are required.

In the present invention, the most remarkable effect can be obtained when nickel is used as catalyst. Another material usable as catalyst may be preferably used one or several kinds of elements selected from Ni, Pd, Pt, Cu, Ag, Au, In, Sn, Pd, Sn, Pd, P, As, Sb.

Next, preferred embodiments according to the present invention will be described.

(Embodiment 1)

In this embodiment, a silicon nitride film of 500 Å is selectively formed and nickel is selectively doped using this silicon nitride film as a mask.

A series of processes in the manufacturing method of this embodiment will be briefly described with reference to FIG. 1.

First, a silicon oxide film of 2000 Å and an amorphous silicon film 12 of 100–1500 Å are sequentially formed on a glass substrate (Corning 7059, 10 cm square) by the plasma CVD method using the apparatus shown in FIGS. 2 and 3. In this case, the amorphous silicon film 12 is formed at a thickness of 1000 Å. A film forming condition of the silicon oxide film is as follows: film forming pressure of 0.1–1 torr (0.3 torr in this embodiment), the ratio of TEOS:$O_2$ is set to 1:10, RF power of 1–500 W (300 W in this embodiment) and a substrate temperature of 100°–500° C. (400° C. in this embodiment). A film forming condition of the amorphous silicon film is as follows: film forming pressure of 0.1–1 torr (0.3 torr in this embodiment), film forming gas of monosilane, RF power of 1–100 W (35 W in this embodiment) and a substrate temperature of 100°–300° C. (160° C. in this embodiment). (FIG. 1(A))

Subsequently, the substrate is fed to the heat treatment chamber 305 without exposing the substrate to atmospheric air, and a heat treatment at 350°–550° C., 400° C. in this case, for one hour under $N_2$ atmosphere is performed on the substrate to remove hydrogen from the amorphous silicon film 12 which is formed by the plasma CVD method.

Thereafter, the substrate 322 is fed to the treatment chamber 304 without exposing the substrate to the atmospheric air, and a silicon nitride film 21 serving as a mask is formed at a thickness of 200 Å or more, at 500 Å in this case. A film forming condition is as follows: film forming pressure of 0.1–1 torr (0.3 torr in this embodiment), the ratio of monosilane:ammonia=1:4, RF power of 100–500 W (300 W in this embodiment) and the substrate temperature of 200°–500° C. (400° C. in this embodiment). On the basis of the experiments which had been performed by the inventors of this application, it was confirmed that no problem occurred even when the silicon nitride film 21 was equal to 100 Å, and thus it is expected that the thickness of the silicon nitride may be smaller if film quality is fine.

Thereafter, the silicon nitride film 21 is patterned in a desired pattern by an ordinary photolitho-patterning process, and a thin silicon oxide film 20 is formed by irradiation of uv rays under an oxygen atmosphere. The formation of the silicon oxide film 20 is performed by irradiation of uv rays for 5 minutes under the oxygen atmosphere. The thickness of the silicon oxide film 20 is guessed to be about 20–50 Å (FIG. 1A). With respect to the silicon oxide film to improve wettability, an adequate doping can be performed with only hydrophilic property of the silicon oxide film when the solution and the pattern size are matched to each other. However, such a case is very rare, and it is generally safety to use the silicon oxide film 20.

In this condition, 5 ml of acetate solution containing 100 ppm nickel is dropped (in case of 10 cm square substrate). At this time, the solution can be prevented from leaking to the back surface of the substrate by coating the substrate with solution while rotating a spinner at 150 rpm. After keeping the substrate in the above state for 5 minutes, a spin dry is performed at 2000 rpm for 60 sec spinning (FIG. 1(B)).

Thereafter, a heat treatment is performed for 8 hours at 550° C. (nitrogen atmosphere) to crystallize the amorphous silicon film 12. At this time, the crystal growth is made in a lateral (horizontal) direction by about 40 μm from a nickel-doped region 22 to a nickel-undoped region as indicated by an arrow 23. In FIG. 1(C), reference numeral 24 represents the region in which nickel was directly doped and thus crystallization occurred, and reference numeral 25 represents the region in which the lateral crystallization occurred. It was confirmed that the crystal growth was made substantially along <111> axis in the region 25.

In this embodiment, the nickel concentration in the nickel-doped region where nickel was directly doped can be controlled to be in the range from $1\times10^{16}$ atoms $cm^{-3}$ to $1\times10^{19}$ atoms $cm^{-3}$ by changing the solution concentration and the keeping time. Likewise, the concentration in the lateral growth region can be also controlled to be below the above range.

It is necessary to exfoliate the mask material if a device is afterwards formed on the substrate thus formed. In this case, when the silicon oxide mask is used like the prior art, the glass substrate and the undercoat silicon oxide would be greatly damaged because hydrofluoric acid etchant or a dry etching with fluoride gas must be used. On the other hand, when the silicon nitride mask is used, heated phosphoric acid can be used as an etchant, and it little damages the crystalline silicon film, the silicon oxide film and the glass substrate.

As described above, the concentration of the catalysts is small and the degree of crystallization is excellent in the region where the lateral crystal growth is made, and thus it is useful to utilize this region as an active region for a semiconductor device. For example, it is remarkably effective to use this region as a channel-forming region for a thin film transistor.

[EMBODIMENT 2]

In this embodiment, an electronic device is formed using a region which was selectively doped with nickel in the same manner as the embodiment 1 and in which the crystal growth was performed in a lateral direction (a direction parallel to the substrate) from a nickel-doped area. When such a construction is adopted, the nickel concentration can be reduced to a lower level, and thus this construction is remarkably preferable in view of electric stability and reliability of the device.

This embodiment relates to a process of manufacturing TFTs which are used to control active matrix pixels. FIG. 4 shows a series of manufacturing processes of this embodiment. First, a substrate 201 is cleaned, and then an undercoat film 202 of silicon oxide is formed at a thickness of 2000 Å by a plasma CVD method using TEOS (tetraethoxysilane) and oxygen as source gas in the multipurpose substrate treatment apparatus shown in FIGS. 2 and 3. Sequentially to the above process, an intrinsic (type I) amorphous silicon film 203 of 500–1500 Å in thickness, for example 1000 Å, is formed by the plasma CVD method. Thereafter, a heat treatment at 450° C. for one hour is performed using a heat treatment furnace 305 to remove hydrogen. After that, an silicon nitride film 205 of 500–2000 Å thickness, for example 1000 Å, is sequentially formed in the same apparatus by the plasma CVD method. Subsequently, the silicon nitride film 205 is selectively etched to form a region 205 in which amorphous silicon is exposed. If the patterning treatment of this region 205 is performed so that the silicon nitride film remains on a region in which islands will be afterwards formed, it is very useful in the process because the patterning treatment of the amorphous silicon film can be performed using the silicon nitride film as a mask after the crystallizing process.

Thereafter, solution (acetate solution in this embodiment) containing nickel which is catalyst prompting crystallization is coated on the substrate according to the method as described in the embodiment 1. The nickel concentration in the acetate solution is set to 100 ppm. The other processes and conditions are the same as those of the embodiment 1.

Figure 4A:
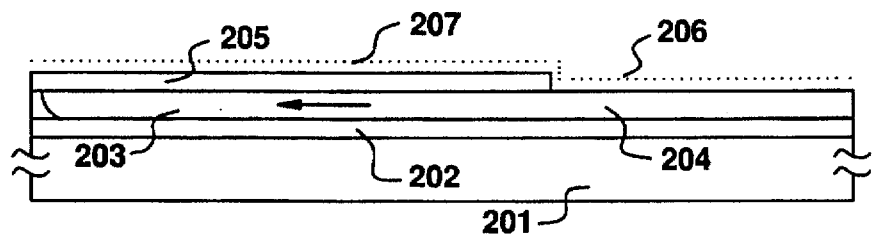
FIGS. 4A to 4F are diagrams showing a series of processes of manufacturing a semiconductor device.

Thereafter, a heat annealing treatment at 500°–620° C., for example, at 550° C. under nitrogen atmosphere is performed for four hours to crystallize a silicon film 303. The crystallization starts from an area where nickel and silicon film are contacted with each other, and progresses in parallel to the substrate as shown by an arrow. In FIGS. 4A to 4F, the region 204 represents a portion where nickel was directly doped and crystallized, and the region 203 represents a portion where the crystallization progressed in the lateral direction. It is confirmed that the crystallization in the lateral direction as represented by reference numeral 203 is extended by about 25 microns, and the direction of the crystal growth is substantially in parallel to the direction of <111> axis. (FIG. 4A).

Subsequently, the crystalline silicon film 204 is subjected to the dry etching treatment to form islands using the silicon nitride film 205 as a mask. Through this process, an etch-off treatment can be performed on the directly-doped region 206 having high nickel concentration. As a result, in this embodiment, the region having high nickel concentration was designed not to be overlapped with a channel-forming region in an active layer 208. Thereafter, the silicon nitride film 208 is etched with heated phosphoric acid to form the islandish active layer region 208.

Subsequently, the active layer (silicon film) 208 is left under an atmosphere of 10 atms containing 100 vol. % water vapor at 500°–600° C., typically 550° C. to oxidize the surface of the active layer and form a silicon oxide film 209. The thickness of the silicon oxide film is set to 1000 Å. After the silicon oxide film 209 is formed by the heat oxidization, the substrate is kept at 400° C. temperature under an ammonia atmosphere (1 atm, 100%). In this state, infrared rays having a peak in the range 0.6–4 μm, for example 0.8–1.4 μm is irradiated to the substrate for 30–180 seconds, and a nitridation treatment is performed on the silicon oxide film 209. In this case, 0.1–10% HCl may be mixed into the atmosphere.

Figure 4B:
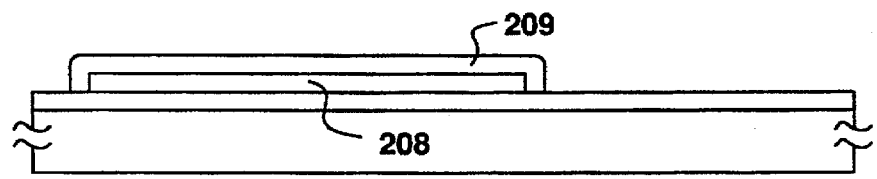
Figure 4C:
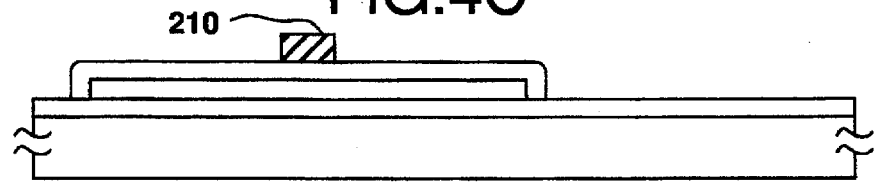

A halogen lamp is used as the infrared ray source. The intensity of the infrared ray is controlled so that the temperature on a single crystal silicon wafer which is used as a monitor is in the range of 900°–1200° C. Specifically, the temperature of a thermo couple which is buried in the silicon wafer is monitored, and fed back to the infrared ray source. In this embodiment, a temperature increasing (heating) rate is set to be constant, 50°–200° C./sec, and a temperature decreasing (cooling) rate is set to be a naturally cooling rate, 20°–100° C./sec. The silicon film is selectively heated by the infrared ray irradiation, so that it can suppress the heating of the glass substrate to the minimum. (FIG. 4B).

Subsequently, an aluminum (containing 0.01–0.2% of scandium) film of 3000–8000 Å in thickness, for example 6000 Å, is formed by a sputtering method. The aluminum film is subjected to the patterning treatment to form a gate electrode 210 (FIG. 2C).

Figure 4D:
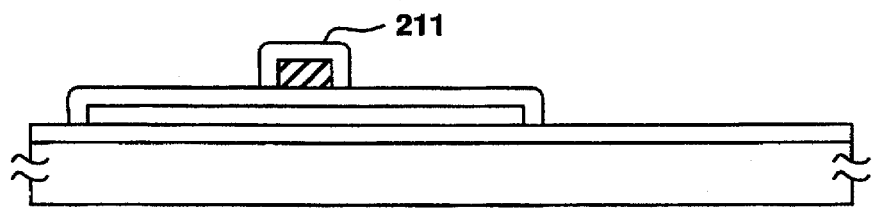

Subsequently, an oxide layer 211 is formed on the surface of the aluminum electrode by performing anodic oxidization on the surface. The anodic oxidization is performed in ethylene glycol solution containing 1–5% of tartaric acid. The thickness of the oxide layer 211 is equal to 2000 Å. The thickness of the oxide layer 211 corresponds to an offset gate region which will be formed in a subsequent ion-doping process, and thus the length of the offset gate region can be determined in the above anodic oxidation process (FIG. 4D).

Subsequently, impurities (in this case, phosphorus) which can provide N-type conductivity is doped in self-alignment into an active region (constructing source/drain and channel regions) using a gate electrode portion, that is, a gate electrode 210 and its peripheral oxide layer 211 as a mask by an ion-doping method (called as a plasma doping method). Phosphine ($PH_3$) is used as doping gas, and an acceleration voltage is set to 60–90 kV, for example 80 kV. A dose amount is set to $1 \times 10^{15}$–$8 \times 10^{15}$ cm$^{-2}$, for example $4 \times 10^{15}$ cm$^{-2}$. As a result, N-type impurity regions 212 and 213 can be formed. As is apparent from the figures, the impurity region and the gate electrode are kept in such an offset state as to be away from each other at a distance x. The offset state like this is particularly effective to reduce a leak current (called as "off current") occurring when a reverse voltage (minus voltage for N channel TFT) is applied to the gate electrode. Especially, it is effective to provide the offset because the leak current is desired to be low so that no charges stored in pixel electrodes leak to obtain a good image in the case of TFTs which control active matrix pixels like this embodiment.

Figure 4E:
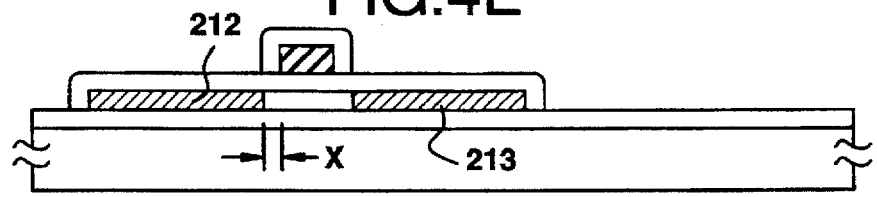

Thereafter, an anneal process is performed by laser irradiation. A KrF excimer laser (wavelength 248 nm, pulse width 20 nsec) is utilized as a laser light source, but another type of laser may be used. The condition of laser irradiation is as follows: the energy density of irradiated laser is 200–400 mJ/cm$^2$, for example 250 mJ/cm$^2$, and irradiation is repeated at 2–10 times, for example 2 times every irradiation target point. In this case, the effect could be enhanced if the substrate is heated at 200°–450° C. during the laser irradiation process (FIG. 4E).

Subsequently, a silicon oxide film 214 of 6000 Å thickness is formed as a layer insulator by the plasma CVD method. Further, a transparent polyimide film 215 is formed by a spin coating method, and the surface thereof is flattened. A transparent electroconductive film (ITO film) of 800 Å thickness is formed on the surface of the polyimide film thus formed by a sputtering method, and then patterned to form a pixel electrode 216.

Figure 4F:
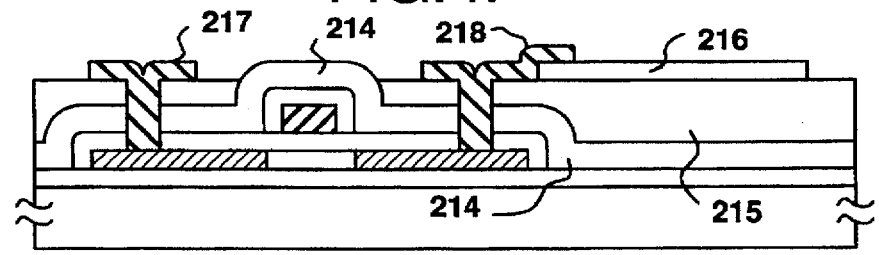

Thereafter, contact holes are formed in layer insulators 214, 215, and electrodes/wires 217 and 218 of the TFTs are formed of metal material, for example, a multilayer film of titanium nitride and aluminum. Finally, an anneal treatment is performed at 350° C. for 30 minutes under a hydrogen atmosphere of 1 atom to complete an active matrix pixel circuit having the TFTs (FIG. 4F).

[EMBODIMENT 3]

FIGS. 5A to 5D are cross-sectional views showing a series of manufacturing processes in a third embodiment of the present invention. First, an undercoat film 102 of silicon oxide is formed at a thickness of 2000 Å on a glass substrate (Corning 7059) 501 by the sputtering method. In a case where the substrate is annealed at a temperature higher than the distortion temperature and then gradually cooled to a temperature below the distortion temperature at 0.1°–1.0° C./minute before or after the undercoat film is formed, a mask alignment work can be facilitated because contraction of the substrate can be suppressed in a subsequent process containing a temperature increasing step (containing a thermal oxidization process and subsequent thermal anneal process of this invention). For the Corning 7059 substrate, it is preferable to anneal the substrate at 620°–660° C. for 1–4 hours, then gradually cool the substrate at 0.03°–1.0° C./min, preferably 0.1°–0.3° C./min and then take out the substrate at a time when the temperature is reduced to 400°–500° C.

Figure 5A:
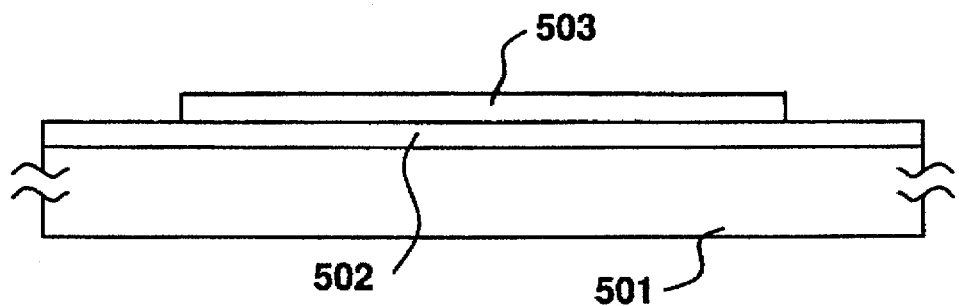
FIGS. 5A to 5D are diagrams showing a series of processes of manufacturing a semiconductor device.

Subsequently, a silicon oxide film, an amorphous silicon film and a silicon nitride film are sequentially formed by the plasma CVD method in the same manner as the embodiment 2. Thereafter, the amorphous silicon film is crystallized by the same method as the embodiment 2, and then the annealing treatment is performed under a nitrogen atmosphere (1 atm) at 600° C. for 48 hours to crystallize the silicon film. Thereafter, the silicon film is subjected to the patterning treatment into 10°–1000 μm square parts to form islandish silicon films (active layers of TFTs) 503 (FIG. 5A).

Subsequently, an oxygen atmosphere of 1 atm, 500°–750° C., typically 600° C. containing 70–90% of water vapor was formed by a pyrogenetic reaction method at hydrogen/oxygen ratio of 1.5–1.9. The substrate is kept in this atmosphere for 3 to 5 hours to oxidize the surface of the silicon surface and form a silicon oxide film 504 of 500–1500 Å, for example, 1000 Å in thickness. it should be noted that the thickness of the surface of the initial silicon film is reduced by 50 Å or more by the oxidization, so that contamination on the uppermost surface of the silicon film does not extend to the silicon-silicon oxide interface, that is, clean silicon-silicon oxide interface can be obtained. The thickness of the silicon oxide film is set to be twice as large as that of the silicon film to be oxidized, and thus the thickness of the residual silicon film is 500 Å when the silicon film of 1000 Å is oxidized to form the silicon oxide film of 1000 Å.

Generally, the thinner the silicon oxide film (gate insulating film) and the active layer are, the more excellent the characteristics are, for example, mobility becomes larger and off-current reduces. On the other hand, as the initial amorphous silicon film is thicker, the crystallization of the amorphous silicon film is more facilitated. Accordingly, there have been conventionally some conflict between characteristics and easiness of the process with respect to the thickness of the active layer. The invention gives the first solution to the conflict. Namely, a high-quality crystalline silicon film is obtained by forming a thicker amorphous silicon film before crystallization, and then the silicon film is oxidized to thin the silicon film, whereby the characteristics of the TFT is improved. In addition, in the thermal oxidation process, amorphous portions and crystal grain boundaries where recombination centers tend to exist are easily oxidized, so that the number of recombination centers in the active layer can be reduced. Therefore, the yield for products can be improved.

Figure 5B:
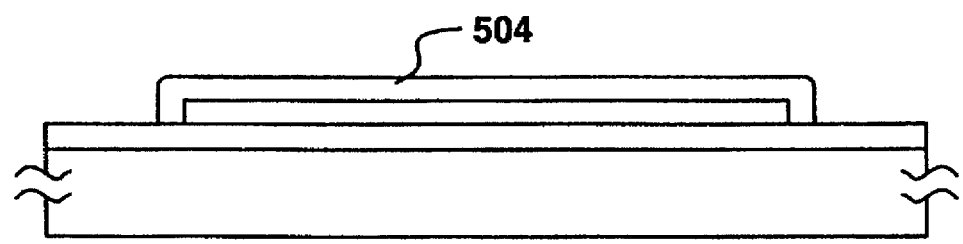

After the silicon oxide film 504 is formed by the thermal oxidation, the substrate is annealed at 600° C. for 2 hours under dinitrogen monoxide atmosphere (1 atm, 100%) (FIG. 5B).

Sequentially, polycrystal silicon (containing 0.01–0.2% of phosphorus) of 3000–8000 Å thickness, 6000 Å for example, is formed by a low pressure CVD method. A gate electrode 505 is formed by patterning the silicon film. Subsequently, impurities (phosphorus in this case) which provide N-type conductivity are doped in self-alignment into an active region (constructing source/drain and channel regions) using the silicon film as a mask by the ion-doping method (called as "plasma doping method"). Phosphine ($PH_3$) is used as doping gas and an acceleration voltage is set to 60–90 kV, 80 kV for example. A dose amount is set to $1 \times 10^{15}$–$8 \times 10^{15}$ cm$^{-2}$, $5 \times 10^{15}$ cm$^{-2}$ for example. Through this process, N-type impurity regions 506 and 507 are formed.

Figure 5C:
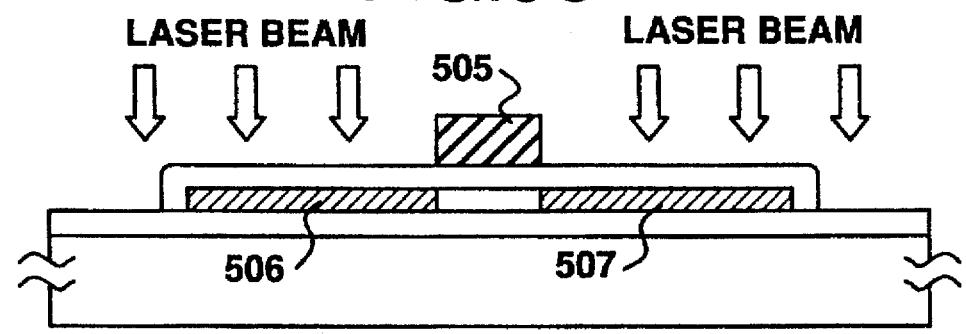

Thereafter, an anneal process is performed by laser irradiation. A KrF excimer laser (wavelength 248 nm, pulse width 20 nsec) is utilized as a laser light source, however, another type of laser may be used. The condition of laser irradiation is as follows: the energy density of irradiated laser is 200–400 mJ/cm$^2$, for example 250 mJ/cm$^2$, and irradiation is repeated at 2–10 times, for example 2 times every irradiation point. The enhancement of the effect can be performed if the substrate is heated at 200°–450° C. during the irradiation process (FIG. 5C).

This process may be performed using a Lamp anneal method using near infrared ray. The near infrared ray is more liable to be absorbed by crystallized silicon than amorphous silicon, and thus an effective annealing treatment which is equivalent to the thermal anneal of 1000° C. or more can be performed. On the other hand, the near infrared rays are hard to be adsorbed by the glass substrate (far infrared rays are absorbed by the glass substrate but visible light and near infrared rays (wavelength 0.5–4 μm) are hard to be absorbed by the glass substrate), it is unnecessary to heat the glass substrate to a high temperature and a process time is very short. Accordingly, this is the best method in a process which induces a contraction problem of a glass substrate.

Figure 5D:
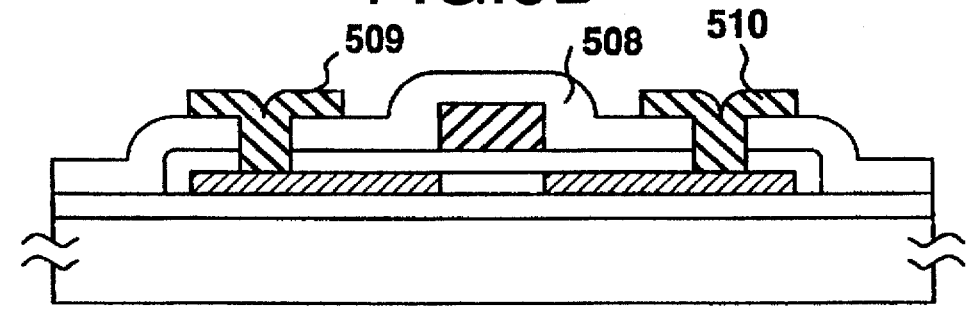

Subsequently, a silicon oxide film 508 of 6000 Å is formed as a layer insulator by the plasma CVD method. Polyimide may be used as the layer insulator. Thereafter, contact holes are formed, and then electrode/wire 509 and 510 of a TFT are formed of metal material, for example a multilayer film of titanium nitride and aluminum. Finally, the anneal treatment is performed at 350° C. for 30 minutes under 1 atm hydrogen atmosphere to complete the TFT (FIG. 5D).

The mobility and S-value of the TFT obtained by the method as described above is measured to be 110–150 cm$^2$/Vs and 0.2–0.5 V/digit, respectively. Further, when P-channel type TFT in which boron is doped into a source/drain region in the same method is formed, the mobility of 90–120 cm$^2$/Vs and S-value of 0.4 to 0.6 V/digit are obtained. This mobility value is higher by 20% or more and this S-value is lower by 20% as compared with those of a case where a gate insulating film is formed by a well-known PVD method or CVD method.

The TFT which is obtained according to the method of this embodiment has equivalent or more excellent reliability as compared with the TFT which is produced by the high temperature thermal oxidization of 1000° C.

[EMBODIMENT 4]

Figure 6:
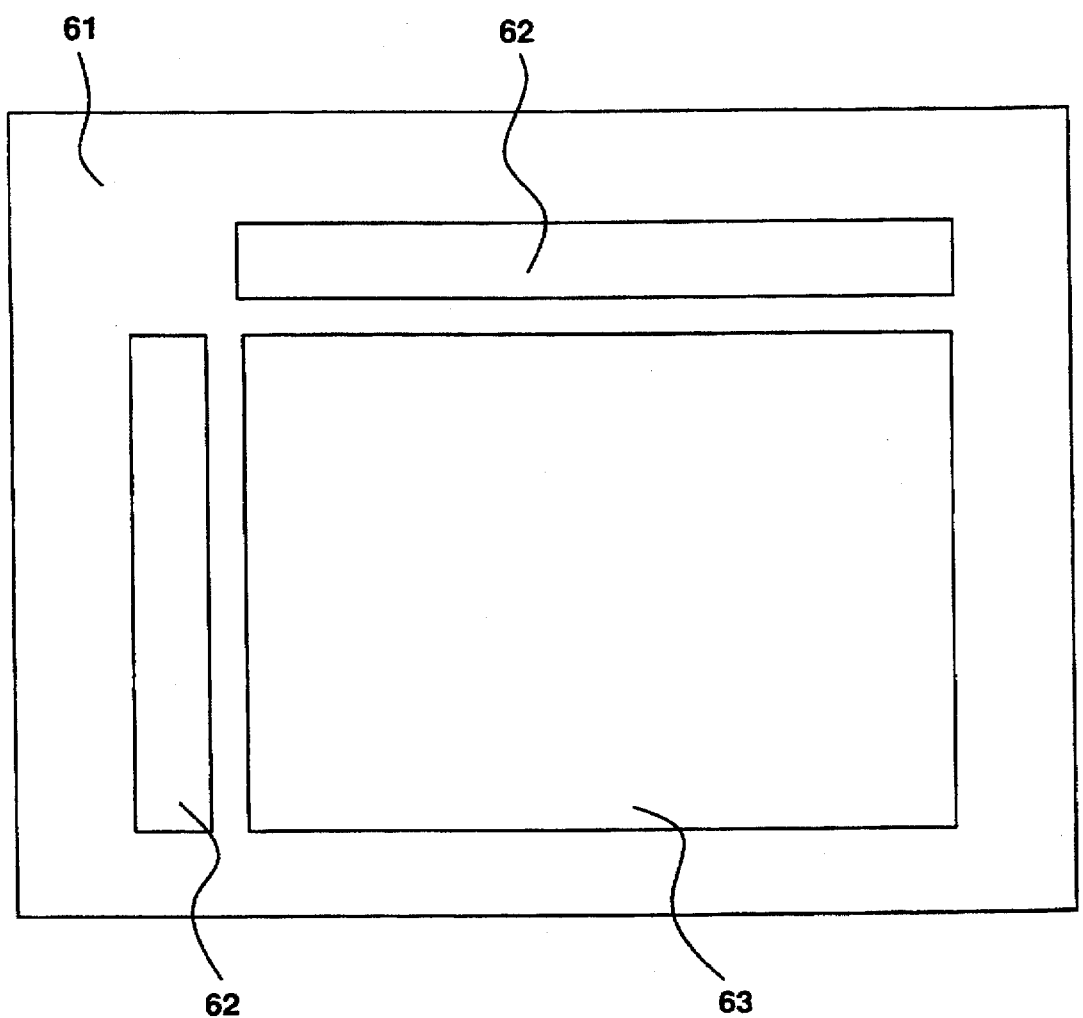
FIG. 6 shows a semiconductor device which is manufactured according to the present invention.

In the embodiment 4, the present invention is applied to an active matrix type liquid crystal display device. FIG. 6 is an plan view showing the outline of one substrate of the active matrix type liquid crystal display device.

In FIG. 6, reference numeral 61 represents a glass substrate and reference numeral 63 represents a pixel area in which pixels of several hundreds X several hundreds are arranged in a matrix form. Each of these pixels is provided with a TFT as a switching element. Driver TFTs for driving the TFTs in the pixel area are provided in peripheral driver areas 62. The pixel area 63 and the driver area 62 are integrally formed into one body on the same substrate 61.

The TFTs placed in the driver regions 62 require a high mobility characteristic because large current are required to flow through these TFTs. On the other hand, the TFTs placed in the pixel region 63 requires a small off-current (leak current) characteristic because they must keep charges at the pixel electrodes fixedly. For example, TFTs which are produced by a simple laser crystallization method using no nickel can be used as the TFTs placed in the pixel region 63. In this case, the laser anneal is performed with the same energy as the crystallization of the nickel-doped peripheral region. A crystalline silicon film which is crystallized with low energy without nickel as described above has a lower mobility due to low crystallinity as compared to a crystalline silicon film produced with use of nickel. However, it has an advantage that the off-current is low as a whole, and thus no problem occurs even when it is used for pixels.

What is claimed is:

1. A method of manufacturing a semiconductor device comprising the steps of:
    forming a silicon oxide film and an amorphous silicon film on a substrate having an insulating surface;
    performing a heat treatment on the substrate sequentially to said silicon oxide film forming step without exposing the substrate to atmospheric air to thereby remove hydrogen from the amorphous silicon film;
    forming a silicon nitride film on the amorphous silicon film sequentially to said hydrogen-removing step;
    patterning the silicon nitride film to selectively expose the amorphous silicon film;
    doping a metal element so as to be contacted with the exposed amorphous silicon film to promote crystal growth of the amorphous silicon film; and
    performing a heat treatment on the amorphous silicon film to crystallize the amorphous silicon film in a direction parallel to the substrate from an area in which the metal element is doped.

2. The method of claim 1 wherein the heat treatment performed to crystallize the amorphous silicon film is performed at a temperature of 450° to 600° C.

3. The method of claim 1 wherein the heat treatment performed to remove the hydrogen from the amorphous silicon film is performed at a temperature of 350° to 550° C.

4. The method of claim 1 wherein the silicon nitride film is formed at a thickness of 200 Å or more.

5. The method of claim 1 further comprising the step of removing the patterned silicon nitride film from on the amorphous silicon film by heated phosphoric acid after the heat treatment performed to crystallize the amorphous silicon film.

6. The method of claim 1 wherein the crystallized silicon film is used in a thin film transistor for an active matrix type electro-optical device.

7. The method of claim 6 wherein the substrate comprises a glass.

8. The method of claim 1 wherein the metal element doping step is carried out by applying a solution containing the metal element therein over the exposed amorphous silicon film.

9. The method of claim 1 wherein the metal element is selected from the group consisting of Ni, Pd, Pt, Cu, Ag, Au, In, Sn, P, As and Sb.

10. A method of manufacturing a semiconductor device comprising the steps of:
    forming a silicon oxide film and an amorphous silicon film on a substrate having an insulating surface;
    performing a heat treatment on the substrate sequentially to said silicon oxide film forming step without exposing the substrate to atmospheric air to thereby remove hydrogen from the amorphous silicon film;
    forming a silicon nitride film on the substrate sequentially to said hydrogen-removing step;
    patterning the silicon nitride film in the form of an active layer to selectively expose the amorphous silicon film;
    doping a metal element so as to be contacted with the exposed amorphous silicon film to promote crystal growth of the amorphous silicon film;

performing a heat treatment on the amorphous silicon film to crystallize the amorphous silicon film in a direction parallel to the substrate from an area in which the metal element is doped; and patterning the crystallized silicon film using the patterned silicon nitride film as a mask to form an active layer.

11. The method of claim 10 wherein the heat treatment performed to crystallize the amorphous silicon film is performed at a temperature of 450° to 600° C.

12. The method of claim 10 wherein the heat treatment performed to remove the hydrogen from the amorphous silicon film is performed at a temperature of 350° to 550° C.

13. The method of claim 10 wherein the silicon nitride film is formed at a thickness of 200 Å or more.

14. The method of claim 10 wherein the active layer is used in a thin film transistor for an active matrix type electro-optical device.

15. The method of claim 14 wherein the substrate comprises a glass.

16. The method of claim 10 wherein the metal element doping step is carried out by applying a solution containing the metal element therein over the exposed amorphous silicon film.

17. The method of claim 10 wherein the metal element is selected from the group consisting of Ni, Pd, Pt, Cu, Ag, Au, In, Sn, P, As and Sb.

18. A method of manufacturing a semiconductor device comprising the steps of:

forming a silicon nitride film on an amorphous silicon film which is formed on a substrate having an insulating surface;

doping a metal element using the silicon nitride film as a mask to promote crystal growth of the amorphous silicon film;

performing a heat treatment to crystallize the amorphous silicon film; and forming an active layer using the silicon nitride film as a mask.

19. The method of claim 18 wherein the metal element is selected from the group consisting of Ni, Pd, Pt, Cu, Ag, Au, In, Sn, P, As and Sb.

* * * * *